US012717249B2

(12) United States Patent
Lipson et al.

(10) Patent No.: US 12,717,249 B2
(45) Date of Patent: Aug. 25, 2026

(54) SPLIT DOUBLE SIDED WAFER AND RETICLE CLAMPS

(71) Applicant: ASML HOLDING N.V., Veldhoven (NL)

(72) Inventors: Matthew Lipson, Stamford, CT (US); Eric Justin Monkman, Fairfield, CT (US); Victor Antonio Perez-Falcon, Bridgeport, CT (US)

(73) Assignee: ASML HOLDING N.V., Veldhoven (NL)

(*) Notice: Subject to any disclaimer, the term of this patent is extended or adjusted under 35 U.S.C. 154(b) by 9 days.

(21) Appl. No.: 17/613,972

(22) PCT Filed: May 11, 2020

(86) PCT No.: PCT/EP2020/062964
§ 371 (c)(1),
(2) Date: Nov. 24, 2021

(87) PCT Pub. No.: WO2020/239400
PCT Pub. Date: Dec. 3, 2020

(65) Prior Publication Data

US 2022/0236649 A1 Jul. 28, 2022

Related U.S. Application Data

(60) Provisional application No. 62/853,900, filed on May 29, 2019.

(51) Int. Cl.

| | |
|---|---|
| ***G03F 7/00*** | (2006.01) |
| ***H01L 21/683*** | (2006.01) |
| ***H10P 72/72*** | (2026.01) |

(52) U.S. Cl.
CPC ........ *G03F 7/70708* (2013.01); *H10P 72/722* (2026.01)

(58) Field of Classification Search
CPC ............. G03F 7/70708; G03F 7/70875; G03F 7/70783; G03F 7/7095; H01L 21/67225;
(Continued)

(56) References Cited

U.S. PATENT DOCUMENTS 4,502,094 A * 2/1985 Lewin .................... H10P 72/72 118/500
10,310,391 B2 6/2019 Lipson et al.
(Continued)

FOREIGN PATENT DOCUMENTS

CN 106796901 5/2017
CN 108139684 6/2018
(Continued)

OTHER PUBLICATIONS

Machine trnaslation of JP 20160097 15 A.*
(Continued)

*Primary Examiner* — Deoram Persaud
(74) *Attorney, Agent, or Firm* — Pillsbury Winthrop Shaw Pittman, LLP

(57) ABSTRACT

An electrostatic clamp and a method for fabricating the same. The electrostatic clamp includes a first stack and a second stack, wherein the first stack is joined with the second stack. Each of the first and second stacks includes a clamp body, one or more electrodes disposed on the clamp body, a dielectric plate disposed on the electrodes, and a plurality of channels inside the clamp body.

20 Claims, 12 Drawing Sheets

(58) Field of Classification Search
CPC ............... H01L 21/682; H01L 21/6831; H01L 21/6833; H01L 21/67103; H01L 21/67109; C03B 23/20; C03B 25/02
See application file for complete search history.

(56) References Cited

U.S. PATENT DOCUMENTS

| | | | | |
|---|---|---|---|---|
| 10,324,383 | B2 | 6/2019 | Lafarre et al. | |
| 2006/0102277 | A1 | 5/2006 | Maria Zaal et al. | |
| 2009/0207392 | A1* | 8/2009 | Rijpma | G03B 7/52 355/30 |
| 2009/0284894 | A1* | 11/2009 | Cooke | H02N 13/00 438/700 |
| 2009/0308538 | A1* | 12/2009 | Yonekura | H10P 72/7614 118/728 |
| 2012/0299253 | A1 | 11/2012 | Kosakai et al. | |
| 2013/0148253 | A1* | 6/2013 | Komatsu | H10P 72/722 361/234 |
| 2013/0308116 | A1* | 11/2013 | Helmus | G03F 7/70708 355/72 |
| 2014/0253900 | A1* | 9/2014 | Cornelissen | G03F 7/70708 355/72 |
| 2015/0214087 | A1* | 7/2015 | Stone | C23C 16/50 427/576 |
| 2015/0349669 | A1 | 12/2015 | Baldus | |
| 2015/0371885 | A1 | 12/2015 | Tamagawa et al. | |
| 2016/0018744 | A1 | 1/2016 | Lafarre et al. | |
| 2017/0242345 | A1* | 8/2017 | Lipson | G03F 7/70708 |
| 2018/0047604 | A1* | 2/2018 | Takemoto | H10P 72/72 |
| 2018/0267414 | A1* | 9/2018 | Delpuerto | G03F 7/7095 |

FOREIGN PATENT DOCUMENTS

| | | |
|---|---|---|
| JP | 2003124298 | 4/2003 |
| JP | 2016009715 | 1/2016 |
| KR | 2015-0146408 | 12/2015 |
| TW | 201723676 | 7/2017 |
| WO | 2011001978 | 1/2011 |
| WO | 2013160026 | 10/2013 |
| WO | 2017060259 | 4/2017 |

OTHER PUBLICATIONS

International Search Report and Written Opinion issued in corresponding PCT Patent Application No. PCT/EP2020/062964, dated Aug. 18, 2020.
Office Action issued in corresponding Chinese Patent Application No. 202080038682.0. dated Jan. 26, 2024.
Office Action issued in corresponding Japanese Patent Application No. 2021-568883, dated Jun. 17, 2024.
Office Action issued in corresponding Chinese Patent Application No. 202080038682.9, dated Jun. 28, 2024.
Office Action issued in corresponding Korean Patent Application No. 10-2021-7038815, dated Nov. 11, 2024.
Office Action issued in corresponding Israeli Patent Application No. 28810221, dated Aug. 31, 2025.
Communication issued in corresponding European Patent Application No. 20725501.9, dated Aug. 22, 2025.

* cited by examiner 804
810

804
808
810

816
804
808
810

816
804
800
808
806
814
810

1212
1000
1022

816
804
1200
1224
808
806
814

810

SPLIT DOUBLE SIDED WAFER AND RETICLE CLAMPS

CROSS-REFERENCE TO RELATED APPLICATIONS

This application is the U.S. national phase entry of PCT Patent Application No. PCT/EP2020/062964, which was filed on May 11, 2020, which claims the benefit of priority of U.S. Provisional Patent Application No. 62/853,900, which was filed on May 29, 2019, and which is incorporated herein in its entirety by reference.

FIELD

The present disclosure relates to an electrostatic clamp for supporting an object, for example a reticle or a substrate, in a vacuum system such as in an extreme ultraviolet (EUV) lithography system.

BACKGROUND

A lithographic apparatus is a machine that applies a desired pattern onto a substrate, usually onto a target portion of the substrate. A lithographic apparatus may be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus includes so-called steppers, in which each target portion is irradiated by exposing an entire pattern onto the target portion at one time, and so-called scanners, in which each target portion is irradiated by scanning the pattern through a radiation beam in a given direction (the “scanning”-direction) while synchronously scanning the target portions parallel or anti-parallel to this scanning direction. It is also possible to transfer the pattern from the patterning device to the substrate by imprinting the pattern onto the substrate.

To print a pattern on a substrate a lithographic apparatus may use electromagnetic radiations. The wavelength of the electromagnetic radiation determines the minimum feature size printed in the resist. As semiconductor technology advances to sub-20 nm nodes, a lithography system with extreme ultraviolet (EUV) radiation is used to provide critical dimensions. Extreme ultraviolet (EUV) radiation can have a wavelength within a range between 4 nm to 20 nm, for example 6.7 nm or 13.5 nm.

During a lithography process, the reticle and the substrate are held in place in the lithographic apparatus by clamps. A lithographic apparatus using EUV radiation may require that the EUV radiation beam path, or at least substantial parts of it, must be kept in vacuum during a lithographic operation. Therefore in an EUV lithographic apparatus, electrostatic clamps are used instead of traditional vacuum chucking.

In addition, a lithographic apparatus using EUV radiation may require temperature regulation of, for example, the reticle and/or the substrate. Heat produced by the absorbed EUV radiation or the unwanted non-EUV radiation may cause deformations in the reticle and/or the substrate. To reduce the deformation, a coolant may be circulated through the electrostatic clamp.

During IC manufacturing, many lithography levels are used to fabricate functional products, where each lithography level can have a different reticle. Therefore a lithographic apparatus changes reticles and wafers frequently during operations in a semiconductor facility.

Accordingly there is a need for reliable and cost effective wafer and reticle clamps for the EUV lithographic apparatus.

SUMMARY

Embodiments of electrostatic clamps and methods for fabricating the same are described in the present disclosure.

In some embodiments, an electrostatic clamp includes a first stack and a second stack, wherein the first stack is joined with the second stack. Each of the first and second stacks includes a clamp body, one or more electrodes disposed on the clamp body, a dielectric plate disposed on the electrodes, and a plurality of channels inside the clamp body.

In some embodiments, the first and second stacks are joined by an optical contact bonding.

In some embodiments, the first stack includes a conductive layer, wherein the conductive layer and the one or more electrodes are on the opposite side of the clamp body.

In some embodiments, the first and second stacks are joined through an electrical force generated between the conductive layer of the first stack and the one or more electrodes of the second stack.

In some embodiments, the clamp body includes an insulator with ultra-low expansion coefficient.

In some embodiments, the plurality of channels are configured to carry a thermally conditioned liquid or gas.

In some embodiments, each of the first and second stacks further includes an insulating layer, configured to electrically isolate the one or more electrodes.

In some embodiments, the dielectric plate includes a plurality of burls.

Another aspect of the current disclosure provides a method for fabricating an electrostatic clamp. The method includes forming a first stack of the electrostatic clamp, forming a second stack of the electrostatic clamp, and joining the first stack with the second stack.

In some embodiments, the forming of the first and second stacks of the electrostatic clamp includes forming a plurality of channels in a clamp body, forming one or more electrodes on the clamp body, forming an insulating layer on the clamp body, and forming a dielectric plate on the one or more electrodes. In some embodiments, the method further includes forming a plurality of burls on the dielectric plate.

In some embodiments, the joining of the first stack with the second stack includes polishing bottom surfaces of the first and second stacks of the electrostatic clamp, wherein the bottom surface and the dielectric plate are on opposite sides of the respective clamp bodies of the first and second stacks. The joining of the first stack with the second stack also includes forming an optical contact bonding between the polished bottom surfaces of the first and second stacks.

In some embodiments, the joining of the first stack with the second stack includes depositing a conductive layer on a bottom surface of the first stack, wherein the bottom surface and the dielectric plate of the first stack are on the opposite sides of the clamp body. The joining of the first stack with the second stack also includes applying a first voltage on the conductive layer of the first stack, and applying a second voltage, different from the first voltage, on the one or more electrodes of the second stack.

Another aspect of the present disclosure provides a lithography apparatus having the above electrostatic clamp.

In some embodiments, the lithography apparatus further includes an illumination apparatus configured to illuminate a pattern on a patterning device, and a projection system configured to project an image of the pattern onto a substrate, wherein the substrate is disposed on the electrostatic clamp.

In some embodiments, the first stack includes a conductive layer, wherein the conductive layer and the one or more electrodes are on the opposite side of the clamp body.

In some embodiments, the first and second stacks are joined through an electrical force generated between the conductive layer of the first stack and the one or more electrodes of the second stack.

In some embodiments, the lithography apparatus further includes an illumination apparatus configured to illuminate a pattern on a patterning device, wherein the patterning device is disposed on the electrostatic clamp, and a projection system configured to project an image of the pattern onto a substrate.

In some embodiments, the first stack includes a conductive layer, wherein the conductive layer and the one or more electrodes are on the opposite side of the clamp body.

In some embodiments, the first and second stacks are joined through an electrical force generated between the conductive layer of the first stack and the one or more electrodes of the second stack.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

Figure 1:
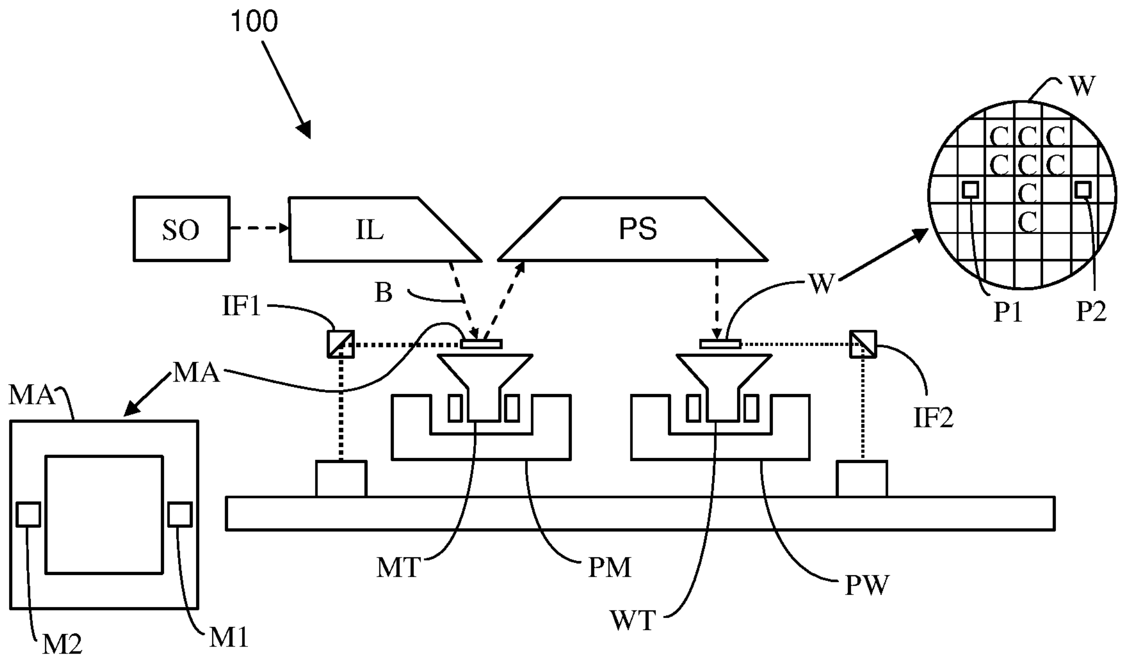
FIG. 1 is a schematic illustration of a reflective lithographic apparatus, according to an exemplary embodiment.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Spatially relative terms, such as "beneath," "below," "lower," "above," "on," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "about" as used herein indicates the value of a given quantity that can vary based on a particular technology. Based on the particular technology, the term "about" can indicate a value of a given quantity that varies within, for example, 10-30% of the value (e.g., ±10%, ±20%, or ±30% of the value).

Embodiments of the disclosure may be implemented in hardware, firmware, software, or any combination thereof. Embodiments of the disclosure may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, and/or instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present disclosure may be implemented.

Exemplary Reflective Lithographic Systems

FIG. 1 is a schematic illustration of a lithographic apparatus 100, in which embodiments of the present invention may be implemented. Lithographic apparatus 100 includes the following: an illumination system (illuminator) IL configured to condition a radiation beam B (e.g., extreme ultra violet radiation); a support structure (for example, a mask table) MT configured to support a patterning device (for example, a mask, a reticle, or a dynamic patterning device) MA and connected to a first positioner PM configured to accurately position the patterning device MA; and, a substrate table (for example, a wafer table) WT configured to hold a substrate (for example, a resist coated wafer) W and connected to a second positioner PW configured to accurately position the substrate W. Lithographic apparatus 100 also has a reflective projection system PS configured to project a pattern imparted to the radiation beam B by patterning device MA onto a target portion (for example, comprising one or more dies) C of the substrate W.

The illumination system IL may include various types of optical components, such as refractive, reflective, catadioptric, magnetic, electromagnetic, electrostatic, or other types of optical components, or any combination thereof, for directing, shaping, or controlling the radiation beam B.

The support structure MT holds the patterning device MA in a manner that depends on the orientation of the patterning device MA with respect to a reference frame, the design of lithographic apparatus 100, and other conditions, such as whether or not the patterning device MA is held in a vacuum environment. The support structure MT may use mechanical, vacuum, electrostatic, or other clamping techniques to hold the patterning device MA. The support structure MT can be a frame or a table, for example, which can be fixed or movable, as required. By using sensors, the support structure MT can ensure that the patterning device MA is at a desired position, for example, with respect to the projection system PS.

The term "patterning device" MA should be broadly interpreted as referring to any device that can be used to impart a radiation beam B with a pattern in its cross-section, such as to create a pattern in the target portion C of the substrate W. The pattern imparted to the radiation beam B can correspond to a particular functional layer in a device being created in the target portion C to form an integrated circuit.

In some embodiments, the patterning device MA may be reflective (as in lithographic apparatus 100 of FIG. 1). Examples of patterning devices MA include reticles, masks, programmable mirror arrays, or programmable LCD panels. Masks are well known in lithography, and include mask types such as binary, alternating phase shift, or attenuated phase shift, as well as various hybrid mask types. An example of a programmable mirror array employs a matrix arrangement of small mirrors, each of which can be individually tilted so as to reflect an incoming radiation beam in different directions. The tilted mirrors impart a pattern in the radiation beam B, which is reflected by a matrix of small mirrors.

The term "projection system" PS can encompass any type of projection system, including refractive, reflective, catadioptric, magnetic, electromagnetic and electrostatic optical systems, or any combination thereof, as appropriate for the exposure radiation being used, or for other factors, such as the use of a vacuum. A vacuum environment can be used for EUV or electron beam radiation since other gases can absorb too much radiation or electrons. A vacuum environment can therefore be provided to the whole beam path with the aid of a vacuum wall and vacuum pumps.

Lithographic apparatus 100 can be of a type having two (dual stage) or more substrate tables WT (and/or two or more mask tables). In such "multiple stage" machines, the additional substrate tables WT can be used in parallel, or preparatory steps can be carried out on one or more tables while one or more other substrate tables WT are being used for exposure. In some situations, the additional table may not be a substrate table WT.

The illuminator IL receives a radiation beam from a radiation source SO. The source SO and the lithographic apparatus 100 can be separate physical entities, for example, when the source SO is an excimer laser. In other cases, the source SO can be an integral part of the lithographic apparatus 100, for example, when the source SO is a mercury lamp. In some embodiments, the source SO is configured to generate a beam of EUV radiation.

The radiation beam B is incident on the patterning device (for example, mask) MA, which is held on the support structure (for example, mask table) MT, and is patterned by the patterning device MA. In lithographic apparatus 100, the radiation beam B is reflected from the patterning device (for example, mask) MA. After being reflected from the patterning device (for example, mask) MA, the radiation beam B passes through the projection system PS, which focuses the radiation beam B onto a target portion C of the substrate W. With the aid of the second positioner PW and position sensor IF2 (for example, an interferometric device, linear encoder, or capacitive sensor), the substrate table WT can be moved accurately (for example, so as to position different target portions C in the path of the radiation beam B). Similarly, the first positioner PM and another position sensor IF1 can be used to accurately position the patterning device (for example, mask) MA with respect to the path of the radiation beam B. Patterning device (for example, mask) MA and substrate W can be aligned using mask alignment marks M1, M2 and substrate alignment marks P1, P2.

With the aid of the second positioner PW and position sensor IF (for example, an interferometric device, linear encoder, or capacitive sensor), the substrate table WT can be moved accurately (for example, so as to position different target portions C in the path of the radiation beam B). Similarly, the first positioner PM and another position sensor (not shown in FIG. 1B) can be used to accurately position the mask MA with respect to the path of the radiation beam B (for example, after mechanical retrieval from a mask library or during a scan).

In general, movement of the mask table MT can be realized with the aid of a long-stroke module (coarse positioning) and a short-stroke module (fine positioning), which form part of the first positioner PM. Similarly, movement of the substrate table WT can be realized using a long-stroke module and a short-stroke module, which form part of the second positioner PW. In the case of a stepper (as opposed to a scanner), the mask table MT can be connected to a short-stroke actuator only or can be fixed. Mask MA and substrate W can be aligned using mask alignment marks M1, M2, and substrate alignment marks P1, P2. Although the substrate alignment marks (as illustrated) occupy dedicated target portions, they can be located in spaces between target portions (known as scribe-lane alignment marks). Similarly, in situations in which more than one die is provided on the mask MA, the mask alignment marks can be located between the dies.

In some embodiments, mask table MT and patterning device MA can be in a vacuum chamber V, where an in-vacuum robot IVR can be used to move patterning devices such as a mask in and out of vacuum chamber. The in-vacuum robots need to be calibrated for a smooth transfer of any payload (e.g., mask) to a fixed kinematic mount of a transfer station.

The lithographic apparatus 100 can be used in at least one of the following modes:

1. In step mode, the support structure (for example, mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C can be exposed.

2. In scan mode, the support structure (for example, mask table) MT and the substrate table WT are scanned synchronously while a pattern imparted to the radiation beam B is projected onto a target portion C (i.e., a single dynamic exposure). The velocity and direction of the substrate table WT relative to the support structure (for example, mask table) MT can be determined by the (de-)magnification and image reversal characteristics of the projection system PS.

3. In another mode, the support structure (for example, mask table) MT is kept substantially stationary holding a programmable patterning device, and the substrate table WT is moved or scanned while a pattern imparted to the radiation beam B is projected onto a target portion C. A pulsed radiation source SO can be employed and the programmable patterning device is updated as required after each movement of the substrate table WT or in between successive radiation pulses during a scan. This mode of operation can be readily applied to maskless lithography that utilizes a programmable patterning device, such as a programmable mirror array.

Combinations and/or variations on the described modes of use or entirely different modes of use can also be employed.

Figures 2, 3:
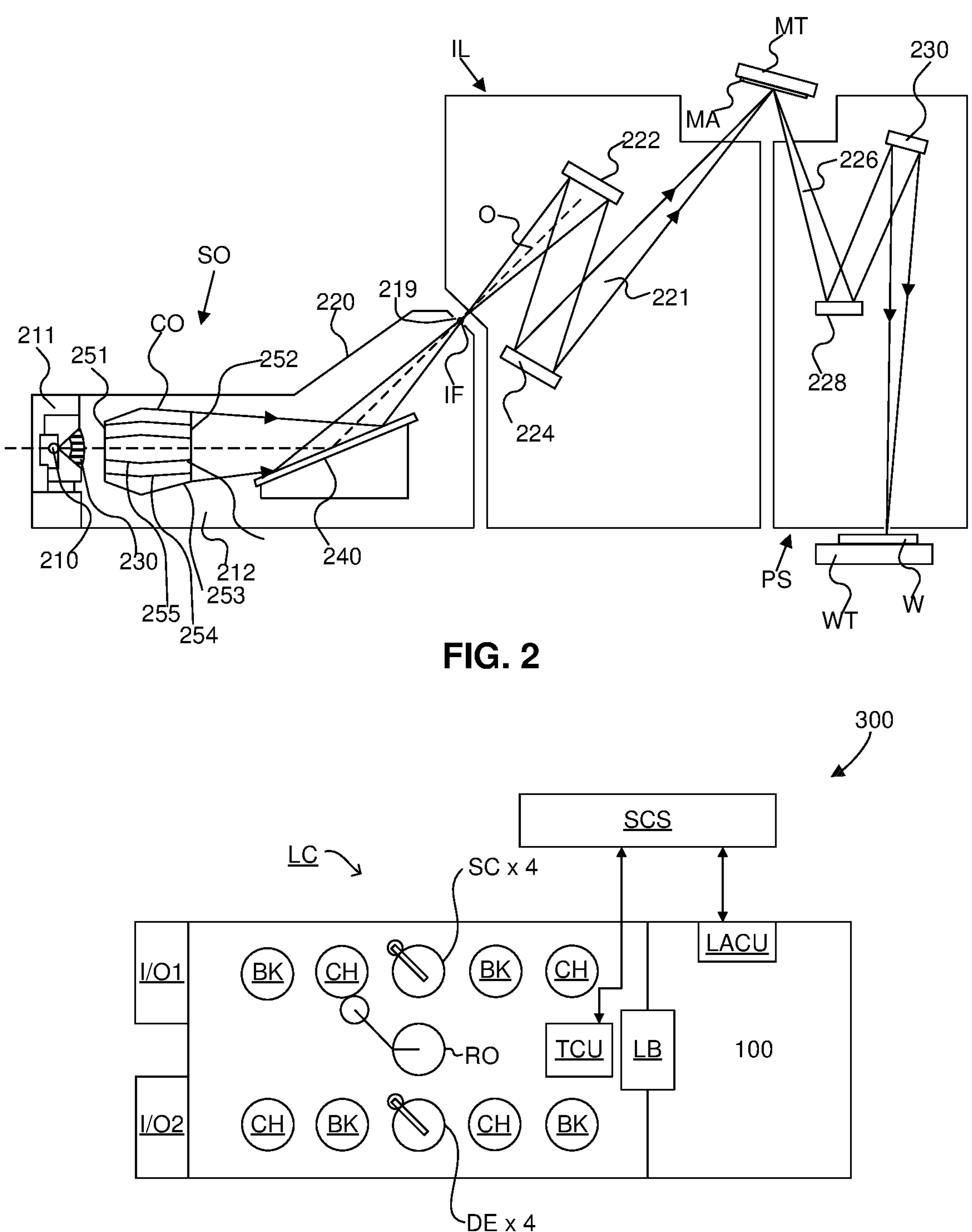
FIG. 2 is a more detailed schematic illustration of the reflective lithographic apparatus, according to an exemplary embodiment.
FIG. 3 is a schematic illustration of a lithographic cell, according to an exemplary embodiment.

FIG. 2 shows the lithographic apparatus 100 in more detail, including the source collector apparatus SO, the illumination system IL, and the projection system PS.

The source collector apparatus SO is constructed and arranged such that a vacuum environment can be maintained in an enclosing structure 220. The source collector apparatus SO includes a source chamber 211 and a collector chamber 212 and is configured to produce and transmit EUV radiation.

EUV radiation may be produced by a gas or vapor, for example Xe gas, Li vapor, or Sn vapor in which an EUV radiation emitting plasma 210 is created to emit radiation in the EUV range of the electromagnetic spectrum. The EUV radiation emitting plasma 210, at least partially ionized, can be created by, for example electrical discharge or laser beam. Partial pressures of, for example, 10 Pa of Xe, Li, Sn vapor, or any other suitable gas or vapor may be required for efficient generation of the radiation. In an embodiment, a plasma of excited tin (Sn) is provided to produce EUV radiation.

The radiation emitted by EUV radiation emitting plasma 210 is passed from the source chamber 211 into the collector chamber 212 via an optional gas barrier or contaminant trap 230 (in some cases also referred to as contaminant barrier or foil trap), which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure.

The collector chamber 212 may include a radiation collector CO, which can be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF. The virtual source point IF is commonly referred to as the intermediate focus, and the source collector apparatus is arranged such that the intermediate focus IF is located at or near an opening 219 in the enclosing structure 220. The virtual source point IF is an image of the radiation emitting plasma 210. Grating spectral filter 240 is used in particular for suppressing infra-red (IR) radiation.

Subsequently the radiation traverses the illumination system IL, which may include a faceted field mirror device 222 and a faceted pupil mirror device 224 arranged to provide a desired angular distribution of the radiation beam 221, at the patterning device MA, as well as a desired uniformity of radiation intensity at the patterning device MA. Upon reflection of the beam of radiation 221 at the patterning device MA, held by the support structure MT, a patterned beam 226 is formed and the patterned beam 226 is imaged by the projection system PS via reflective elements 228, 229 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more mirrors present than those shown in the FIG. 2, for example there may be one to six additional reflective elements present in the projection system PS than shown in FIG. 2.

Collector optic CO, as illustrated in FIG. 2, is depicted as a nested collector with grazing incidence reflectors 253, 254, and 255, just as an example of a collector (or collector mirror). The grazing incidence reflectors 253, 254, and 255 are disposed axially symmetric around an optical axis O and a collector optic CO of this type is preferably used in combination with a discharge produced plasma source, often called a DPP source.

Exemplary Lithographic Cell

FIG. 3 shows a lithographic cell 300, also sometimes referred to a lithocell or cluster. Lithographic apparatus 100 may form part of lithographic cell 300. Lithographic cell 300 may also include one or more apparatuses to perform pre- and post-exposure processes on a substrate. Conventionally these include spin coaters SC to dispose resist layers, developers DE to develop exposed resist, chill plates CH, and bake plates BK. A substrate handler, or robot, RO picks up substrates from input/output ports I/O1, I/O2, moves them between the different process apparatuses and delivers them to the loading bay LB of the lithographic apparatus 100. These devices, which are often collectively referred to as the track, are under the control of a track control unit TCU, which is itself controlled by a supervisory control system SCS, which also controls the lithographic apparatus via lithography control unit LACU. Thus, the different apparatuses can be operated to maximize throughput and processing efficiency.

Exemplary Electrostatic Clamp

Figures 4A, 4B:
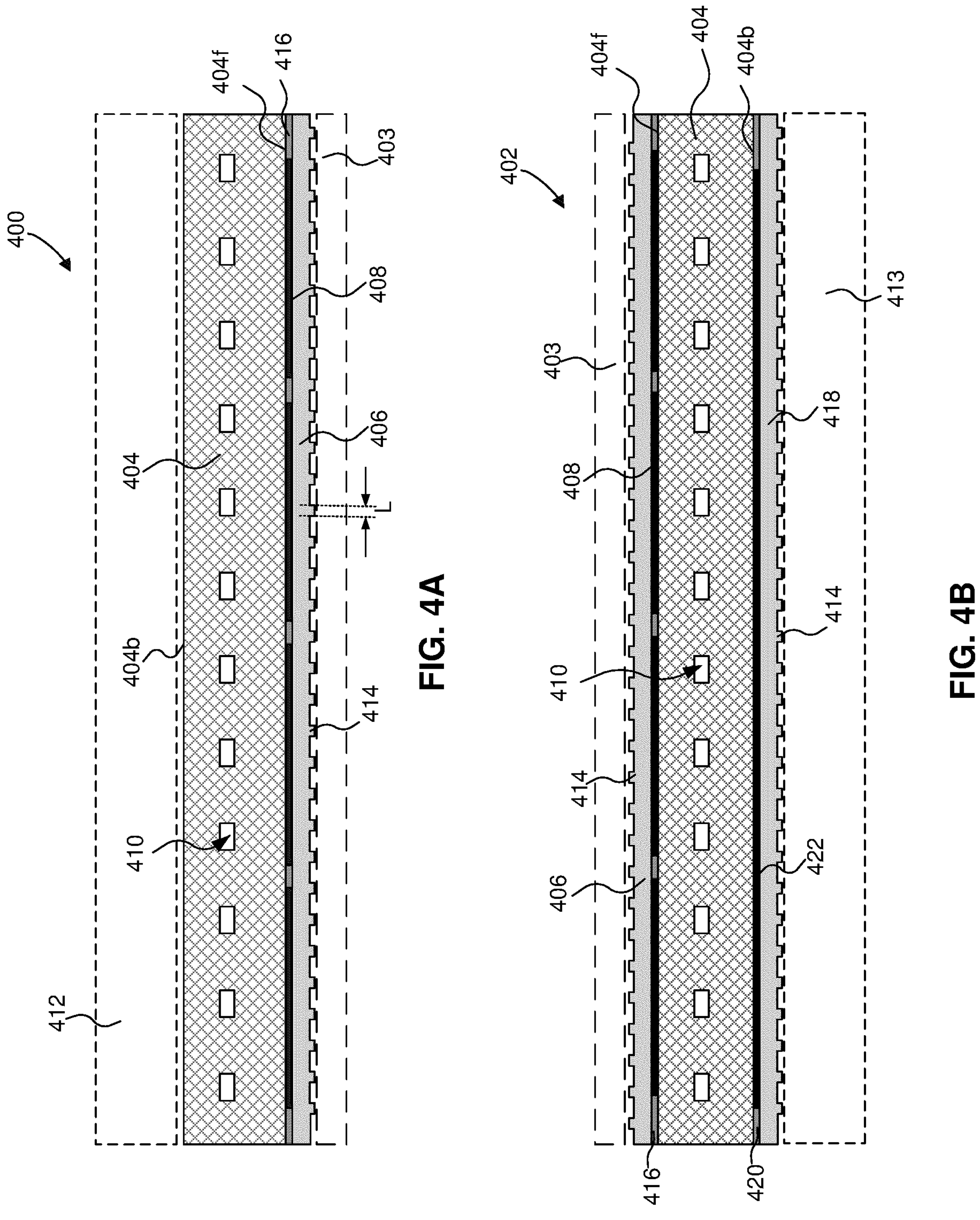
FIGS. 4A and 4B are schematic illustrations of electrostatic clamps, according to some embodiments of present disclosure.

FIGS. 4A and 4B illustrate schematics of cross-sectional views of exemplary electrostatic clamps 400 and 402 that can be configured to hold objects 403 during an operation in the lithographic apparatus 100, according to some embodiments. The object 403 can be a patterning device (e.g., a reticle) or a substrate (e.g., a wafer). In one example, the electrostatic clamp 400 can be used to hold the patterning device (e.g., a reticle) MA on the support structure MT of the lithographic apparatus 100, and the electrostatic clamp 402 can be used for holding the substrate (e.g. a wafer) W on the substrate table WT. In this example, the electrostatic clamp 400 is also referred to as a reticle clamp 400, and the electrostatic clamp 402 is also referred to as a wafer clamp 402.

According to an embodiment, the electrostatic clamps 400 and 402 include a clamp body 404, a dielectric plate 406 and electrodes 408. In some embodiments, the electrostatic clamps 400 and 402 also include a plurality of channels 410 embedded inside the clamp body 404.

The clamp body 404 has opposing and parallel surfaces 404*f* and 404*b*. The surface 404*f* is closer to the object 403 (e.g., reticle or wafer). The surface 404*b* can be closer to a reticle chuck 412 (shown in FIG. 4A), which is located on the support structure MT in the lithographic apparatus 100 (in FIGS. 1-2). The surface 404*b* can be close to a wafer chuck 413 (shown in FIG. 4B) located on the substrate table WT in the lithographic apparatus 100 (in FIGS. 1-2).

In some embodiments, the clamp body 404 can be made of an insulator configured to provide mechanic support to the object and to isolate an electrostatic field during operation of the electrostatic clamps 400 and 402, as further explained in below. In some embodiments, the insulator may have an ultra-low thermal expansion coefficient, and can include, for example, an ultra-low expansion silicon-based material (e.g., ULE® manufactured by Corning), a glass material, a ceramic material, a silicon-based glass ceramic material (e.g., ZERODUR® manufactured by SCHOTT), or any combination thereof. By using materials with ultra-low thermal expansion, thermal stress can be reduced during high temperature manufacturing of the electrostatic clamps 400 and 402. High thermal stress may result in deformations in the electrostatic clamps 400 and 402, which can be transferred to the object 403 during a clamping operation when the object 403 is mounted on the electrostatic clamp 400 or 402 on the substrate table WT or the support structure MT.

In some embodiments, the dielectric plate 406 can be made of an insulator, and can also have ultra-low thermal expansion coefficient. In some embodiment, the dielectric plate 406 can be made of the same material as the clamp body 404, such that thermal stress due to thermal expansion mismatch between dissimilar materials can be minimized. In some embodiments, the dielectric plate 406 can also be made of a material with substantially matched properties to the reticle or wafer.

In some embodiments, the dielectric plate 406 can also include a plurality of burls 414, wherein the burls 414 contact object 403 or chuck 412 during the clamping operation. The burls 414 have smaller lateral dimensions (e.g., "L" illustrated in FIG. 4A), such that a total contacting area with the object 403 can be reduced. As such, the burls 414 can help to provide tight contact with object 403 because statistically a contamination particle is less likely to land on a small surface area than a large flat surface. Furthermore, given a certain clamping force, the pressure between the electrostatic clamp 400 or 402 and the object 403 is increased with a smaller contacting area. Therefore a tighter contact can be formed.

In some embodiments, the electrodes 408 of the electrostatic clamp 400 or 402 are located between the clamp body 404 and the dielectric layer 406, and each electrode 408 is separated from another electrode by an insulating layer 416. In some embodiments, the electrode 408 and the insulating layers 416 are coplanar. In some embodiments, the electrodes 408 can be made of any suitable conductive material such as metal or metal alloy, for example, aluminum, chrome, platinum, gold, or any combination thereof. In some embodiments, the insulating layer 416 can be made of any suitable insulator such as silicon oxide, silicon nitride, silicon oxynitride, polyimide, spin-on-glass, etc.

The electrodes 408 can be applied with a voltage in a range between 100 to 5000 V, and can generate an electrical field across the dielectric plate 406, wherein the electrical field can induce opposite charges (also called "mirror charges") on a conductive surface of the object 403. The attractive force between the electrode and the mirror charges hold the object in close contact with the electrostatic clamp 400 or 402. In some embodiments, the object 403 include a semiconductor wafer, wherein the semiconductor material on the backside of the semiconductor wafer can have a conductive surface. As such the electrostatic clamp 402 can induce mirror charges on the backside of the semiconductor wafer and therefore hold the wafer in place (facing up in FIG. 4B). In some embodiments, the object 403 include a reticle, wherein the backside of the reticle can be coated with a conductive thin film. Similarly the electrostatic clamp 400 can induce mirror charges on the backside of the reticle and thereby hold the reticle in place (upside down in FIG. 4A).

In some embodiments, the applied voltages on the electrodes 408 can create large electric field across the dielectric plate 406, however, the leakage current can be very small. In some embodiment, the thickness and material of the dielectric plate 406 are selected such that the leakage current between the electrode 408 and the object 403 is negligible and the breakdown voltage associated with the high electrical field is above the operation voltage range for the electrostatic clamps 400 and 402. The mirror charges induced on the conductive surface of the object 403 is also referred to as electrostatic charges. Similarly, the distance between each electrode 408 and the material of the insulating layer 416 are selected such that leakage current between the electrodes 408 is also negligible, and the breakdown voltage of the insulating layer 416 is above the operation voltage range for the electrostatic clamps 400 and 402.

In FIG. 4B, the electrostatic clamp (e.g., wafer clamp) 402 include a bottom dielectric plate 418, a bottom insulating layer 420 and a bottom electrode 422, configured to hold the wafer clamp 402 on the wafer chuck 413 located on the substrate table WT in FIGS. 1-2. The material and the structure of the bottom dielectric plate 418, the bottom insulating layer 420 and the bottom electrode 422 are similar to the dielectric plate 406, the insulating layer 416 and the electrode 408, respectively. Because the wafer chuck 413 is typically made of metallic material or coated with metallic material and can be electrically grounded (or applied with an external voltage directly), a single bottom electrode 422 can be sufficient for the wafer clamp 402. In this example, an electrical field can be directly established between the bottom electrode 422 and the wafer chuck 413 due to difference in electrical potential (e.g., different voltage value). As such, the wafer clamp 402 can be held onto the wafer chuck 413 by the electrical force.

Although FIGS. 4A and 4B illustrate only four electrodes 408, it is to be understood that the electrostatic clamp 400 or 402 can include fewer or more electrodes. Similarly, the bottom electrode 422 in FIG. 4B is not limited to a single electrode.

In some embodiments, the channel 410 of the electrostatic clamps 400 and 402 are parallel to surface 404*f* or 404*b*. The channel 410 can be configured to carry a thermally conditioned liquid or gas, such as but not limited to water, air, alcohols, glycols, or phase change coolants (e.g., Freons, carbon dioxide). An external pump (not shown) may be used to regulate the temperature and drive the circulation of the liquid or gas through the channel 410.

The circulating thermally conditioned liquid or gas may help to regulate temperature of electrostatic clamps 400 and 402 to a desired temperature. Temperature regulation of electrostatic clamps 400 and 402 can include absorbing unwanted heat by the thermally conditioned fluid from electrostatic clamps 400 and 402. This unwanted heat may be transferred through clamping surface and/or burls to electrostatic clamp 400 and 402 from object 403 in a clamped state.

In some embodiments, the lithographic apparatus 100 is an EUV system. The object 403 such as reticle or wafer can absorb the EUV radiation during operation, and absorbed optical energy can result in thermal heat and rising temperature in the object 403, causing deformation (e.g. warpage) of the object and thereby errors in the pattern transfer during lithography. By running cooling wafer through the channels 410, the temperature of the electrostatic clamps 400 and 402 can be kept relatively constant. Extra heat from the object 403 (e.g., the wafer or reticle) can be dissipated through the chilled clamps 400 or 402.

As illustrated in FIG. 4B, the electrostatic clamp 402 can be used as a wafer clamp. In this example, the electrostatic clamp 402 relies on electrical force to hold the wafer 403 in place and attach to the wafer chuck 413. The electrical force can be generated between the electrode 408 and mirror charges on the wafer 403. The electrical force can also be generated between the bottom electrode 422 and the wafer chuck 413 (e.g., electrically grounded).

As illustrated in FIG. 4A, the electrostatic clamp 400 can be used as a reticle clamp. In this example, the electrostatic clamp 400 can hold the reticle 403 in place through electrical force between the electrodes 408 and induced mirror charges in the reticle. In some embodiments, the reticle clamp 400 can be attached to the reticle chuck 412 through an "optical contact" at surface 404*b*. In this example, "optical contact" is referred to a direct bonding between substantially defect free and highly polished surfaces without the use of any bonding material, such as epoxy or any other adhesive material. "Optical contact" may result from intermolecular interactions, such as Van der Waals forces between bonding surfaces. In some embodiments, annealing can transform the Van der Waals force into stronger covalent bonding, and can thereby strengthen the bonded structure.

During the fabrication of integrated circuits (ICs), lithography processes are extensively used to form design patterns on the semiconductor wafers. In a manufacturing facility, large quantity of semiconductor wafers are processed in a lithography tool. The number of wafers can be processed within a certain time (e.g., wafer-per-hour) is a figure of merit for productivity. Therefore the wafer clamp for a lithography tool needs to facilitate a fast and easy wafer change, as well as easy replacement of damaged or worn wafer clamps due to high usage. Wafer clamp 402 shown in FIG. 4B enables these features, however double electrodes on a single electrostatic clamp is difficult and expensive to make.

Although advanced semiconductor technology nodes require more than 50 lithography levels, each level with a specially designed reticle, changing reticle happens less frequently than changing wafers. The electrostatic clamp 400 shown in FIG. 4A has electrodes 408 on a single side closer to the reticle 403, which can be easier and cheaper to make. The attachment of the reticle clamp 400 to the reticle chuck 412, however, is through optical contact (or direct bonding), which can be performed only in a special environment by people skilled in the art. When the reticle clamp 400 has problem that requires replacement, the entire reticle clamp 400 and the reticle chuck 412 must be replaced and can only be detached in the special environment. This problem can negatively impact productivity and increase manufacturing cost.

In the present disclosure, an electrostatic clamp with dual stacks and methods for making the same are disclosed. The electrostatic clamp with dual stacks can provide fast and easy wafer/reticle change, as well as fast and easy wafer/reticle clamp change. The dual stacks of the disclosed electrostatic clamp can be manufactured in parallel, thereby improving cycle time and yield.

Exemplary Electrostatic Clamp with Dual Stacks

Figure 5:
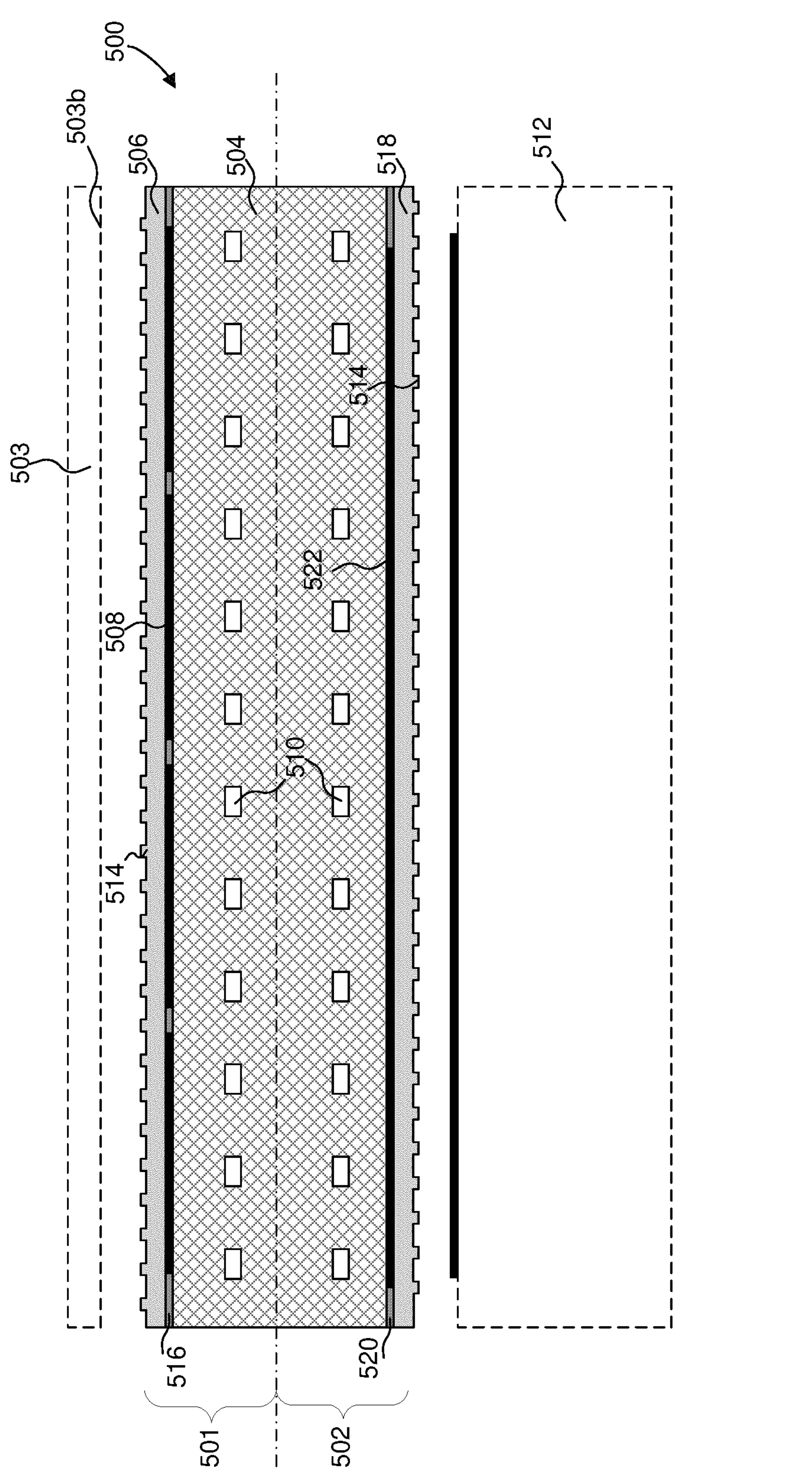
FIG. 5 is a schematic illustration of an electrostatic clamp with dual stacks, according to one embodiment of present disclosure.

FIG. 5 illustrates an exemplary electrostatic clamp 500 with dual stacks (e.g., a first stack 501 and a second stack 502), according to some embodiments of present disclosure. The first stack 501 of the electrostatic clamp 500 includes a first dielectric plate 506 and a first electrode 508. The second stack 502 of the electrostatic clamp 500 includes a second dielectric plate 518 and a second electrode 522. In this example, the first stack 501 and the second stack 502 are joined as one piece at a clamp body 504. The first dielectric plate 506 and the second dielectric plate 518 are located on opposite sides of the clamp body 504. The first electrode 508 is sandwiched between the first dielectric plate 506 and the clamp body 504. The second electrode 522 is sandwiched between the second dielectric plate 518 and the clamp body 504. In some embodiments, each of the first and second stack 501 and 502 of the electrostatic clamp 500 includes a plurality of channels 510 embedded inside the clamp body 504.

In some embodiments, the electrostatic clamp 500 can be configured to clamp onto a chuck 512 and an object 503 during an operation in the lithographic apparatus 100. The object 503 can be a patterning device (e.g., a reticle) or a substrate (e.g., a wafer). In one example, the electrostatic clamp 500 can be used to hold the patterning device (e.g., a reticle) MA on the chuck 512 of the support structure MT of the lithographic apparatus 100. In another example, the electrostatic clamp 500 can also be used to hold the substrate (e.g. a wafer) W on the chuck 512 of the substrate table WT. As such, the electrostatic clamp 500 with dual stacks can be used as a reticle clamp or a wafer clamp.

In some embodiments, the electrostatic clamp 500 can be clamped onto the object 503 through the first electrode 508 and can be clamped onto the chuck 512 through the second electrode 522. During the clamping operation, the object 503 and the chuck 512 are in contact with the first and the second dielectric plate 506 and 518, respectively.

In some embodiments, the clamp body 504 can be made of an insulator, similar to the material used for the clamp body 404 of electrostatic clamp 400 or 402 in FIGS. 4A and 4B. In this example, the clamp body 504 can be made of an insulator with an ultra-low thermal expansion coefficient, and can include, for example, an ultra-low expansion silicon-based material (e.g., ULE® manufactured by Corning), a glass material, a ceramic material, a silicon-based glass ceramic material (e.g., ZERODUR® manufactured by SCHOTT), or any combination thereof.

In some embodiments, the first and second dielectric plates 506 and 518 can be made of similar insulator as that of the dielectric plate 406 or 418. The first and second dielectric plates 506 and 518 can be made of an insulator having ultra-low thermal expansion coefficient. In some embodiment, the first and second dielectric plates 506 and 518 can be made of the same material as the clamp body 504, such that thermal stress due to thermal expansion mismatch between dissimilar materials can be minimized.

In some embodiments, the first and second dielectric plates 506 and 518 can also include a plurality of burls 514, wherein the burls 514 can provide better contact with the object 503 or chuck 512 during the clamping operation. The size and function of the burls 514 are similar to the burls 414 shown in FIGS. 4A and 4B.

In some embodiments, the first and second electrodes 508 and 522 of the electrostatic clamp 500 are also electrically isolated by a first and a second insulating layer 516 and 520, respectively. In some embodiments, the first and second electrodes 508 and 522 are coplanar with the first and second insulating layers 516 and 520, respectively. In some embodiments, the first and second electrodes 508 and 522 can be made of any suitable conductive material such as metal or metal alloy, for example, aluminum, chrome, platinum, gold, or any combination thereof. In some embodiments, the first and second insulating layers 516 and 520 can be made of any suitable insulator such as silicon oxide, silicon nitride, silicon oxynitride, polyimide, spin-on-glass, etc.

In some embodiments, the first and second electrodes 508 and 522 can be applied with a voltage in a range between 100 to 5000 V, and can generate an electrical field across the first and second dielectric plates 506 and 518, respectively, similar to the electrodes 408 and 422 in FIGS. 4A and 4B. The electrical field across the first and second dielectric plates 506 and 518 can induce opposite charges (also called "mirror charges") on conductive surfaces of the object 503 and the chuck 512, respectively, and thereby generate attractive forces between the first electrode 508 and the mirror charges on the object 503 and between the second electrode 522 and the mirror charges on the chuck 512. As such, the electrostatic clamp 500 can hold the object 503 and the chuck 512 in close contact.

In some embodiments, the object 503 can be a semiconductor wafer, wherein a backside 503*b* of the semiconductor wafer can have a conductive surface. As such, the electrostatic clamp 500 can induce mirror charges on the backside 503*b* of the semiconductor wafer and therefore hold the wafer in place. In some embodiments, the object 503 can be a reticle, wherein the backside 503*b* of the reticle can be coated with a conductive thin film, for example, a layer of chrome. Similarly the electrostatic clamp 500 can induce mirror charges on the backside 503*b* of the reticle and thereby hold the reticle in place.

In some embodiments, the electrostatic clamp 500 can be configured to clamp onto the chuck 512 located on the support structure MT or the substrate table WT in FIGS. 1-2. In some embodiments, the chuck 512 can be made of metallic material or coated with metallic material. In this example, the chuck 512 can be electrically grounded or applied with an external voltage directly. Therefore, an electrical field can be directly established between the second electrode 522 and the chuck 512 when they are applied with different electrical biases. An electrical force from the electrical field can hold the electrostatic clamp 500 onto the chuck 512. It is noted that the numbers of the first and second electrodes 508 and 522 are not limited to the ones illustrated in FIG. 5. The electrostatic clamp 500 can include fewer or more electrodes, which is known to those skilled in the art.

Similar to the dielectric plates 406/418 in FIGS. 4A and 4B, the thickness and material of the first and second dielectric plates 506 and 518 can be selected such that the leakage current between the first and second dielectric plates 506/518 and the object 503/chuck 512 is negligible and the breakdown voltage associated with the high electrical field is above the operation voltage range for the electrostatic clamp 500. Similarly, the width and the material of the first and second insulating layers 516 and 520 can be selected such that leakage current between the electrodes (e.g. between each first electrodes 508 in FIG. 5) is also negligible, and the breakdown voltage of the first and second insulating layers 516 and 520 is above the operation voltage range for the electrostatic clamp 500.

In some embodiments, the electrostatic clamp 500 includes at least two rows of channels 510, each row running parallel to surfaces of electrostatic clamp 500, one row closer to the first electrode 508 and the other row closer to the second electrode 522. Similar to the channel 410 in FIGS. 4A and 4B, the channel 510 can be configured to carry a thermally conditioned liquid or gas, such as but not limited to water, air, alcohols, glycols, or phase change coolants (e.g., Freons, carbon dioxide). An external pump (not shown) may be used to regulate the temperature and drive the circulation of the liquid or gas through the channel 510. The circulating thermally conditioned liquid or gas may help to regulate temperature of electrostatic clamp 500 to a desired temperature. The configuration of at least two rows of channels 510 enables thermal control of opposite sides of the electrostatic clamp 500 separately. For example, the channels 510 closer to the first electrodes 508 can circulate cooling water and can be used to chill the object 503 during clamping operation. In another example, the channels 510 closer to the second electrodes 522 can circulate warm water so that the chuck 512 can be kept at room temperature during clamping operation.

Figure 6:
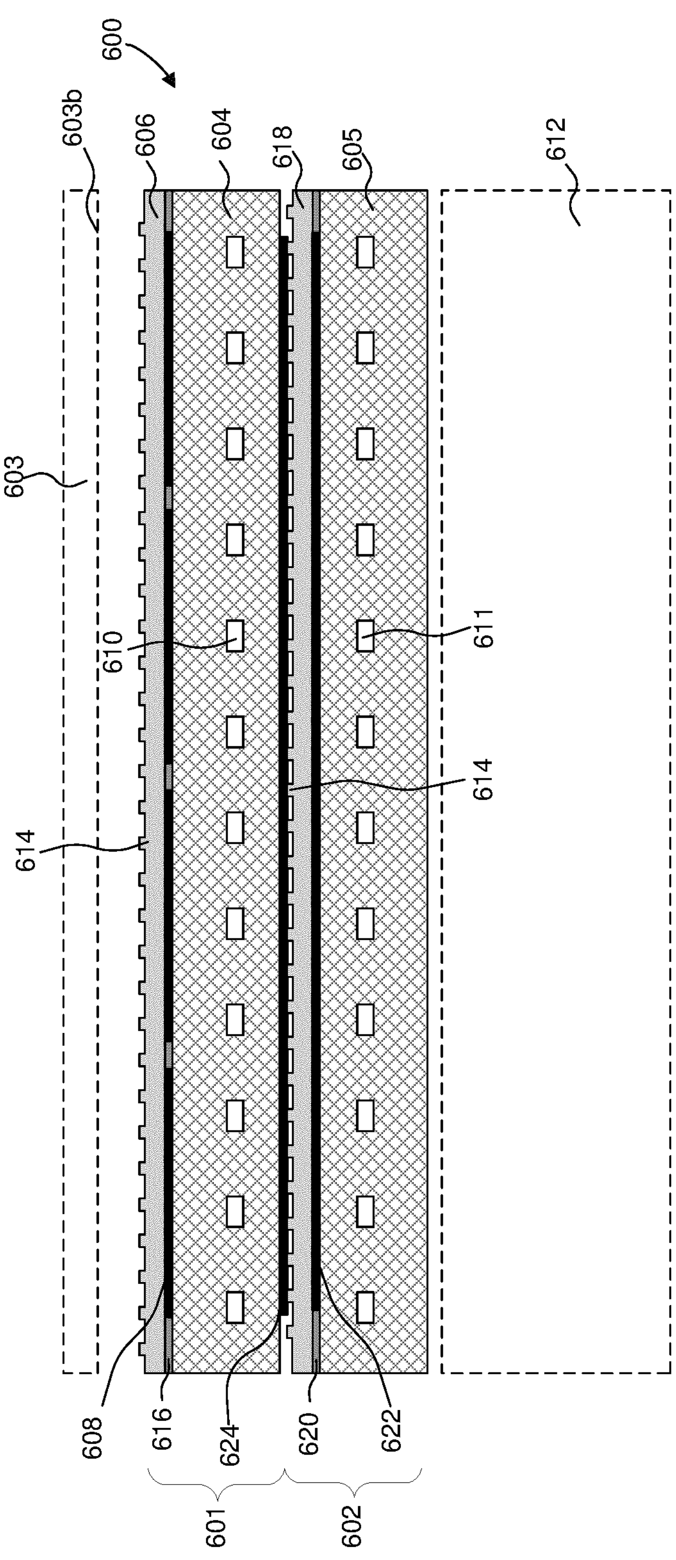
FIG. 6 is a schematic illustration of an electrostatic clamp with dual stacks, according to another embodiment of present disclosure.

FIG. 6 illustrates an exemplary electrostatic clamp 600 with dual stacks (e.g., a first stack 601 and a second stack 602), according to some embodiments of present disclosure. In this example, the first stack 601 is stacked over the second stack 602. The first and second stacks 601 and 602 of the electrostatic clamp 600 include first and second clamp bodies 604 and 605, respectively. In some embodiments, a first electrode 608 and a first dielectric plate 606 are disposed on top of the first clamp body 604. A second electrode 622 and a second dielectric plate 618 are disposed on the second clamp body 605. A conductive layer 624 is disposed on the first clamp body 604, opposite side from the first electrode 608 and the first dielectric plate 606. In this example, the conductive layer 624, the second dielectric plate 618 and the second electrode 622 are located in between the first clamp body 604 and the second clamp body 605. In some embodiments, the electrostatic clamp 600 includes a plurality of channels 610 embedded inside the first clamp body 604 and a plurality of channels 611 embedded inside the second clamp body 605. Each of the first and second dielectric plates 606 and 618 includes a plurality of burls 614. The electrostatic clamp 600 also includes first and second insulating layers 616 and 620, configured to isolate the first and second electrodes 608 and 622, respectively.

In some embodiments, the first and second dielectric plates 606 and 618 are similar to the first and second dielectric plates 506 and 518 of the electrostatic clamp 500 in FIG. 5. In some embodiments, the first and second electrodes 608 and 622 are similar to the first and second electrodes 508 and 522 of the electrostatic clamp 500. In some embodiments, the first and second insulating layers 616 and 620 are similar to the first and second insulating layers 516 and 520 of the electrostatic clamp 500. In some embodiments, the first and second channels 610 and 611 are similar to the channel 510 of the electrostatic clamp 500. In some embodiments, the burls 614 are similar to the burls 514 of the electrostatic clamp 500.

In some embodiments, the electrostatic clamp 600 can be configured to hold an object 603 when the first electrodes 608 are properly biased with certain voltages. For example, positive and negative electrically voltages can be alternatingly applied to the first electrodes 608. Each of the first electrodes 608 can be adjacent to two oppositely biased first electrodes 608. Similar to the first electrodes 508 of the electrostatic clamp 500, the first electrodes 608 can induce mirror charges on a conductive surface 603*b* of the object 603. The electrical field and thereby the attractive electrical force between the first electrodes 608 and the mirror charges on the object 603 can be strong enough to hold the object 603 in tight contact with the electrostatic clamp 600.

In some embodiments, certain electrical voltages can be applied to the second electrode 622 and the conductive layer 624 such that electrical potential of the second electrode 622 and the conductive layer 624 can be different, and thereby creating an attractive electrical field and electrical force across the second dielectric plate 618. For example, the second electrode 622 can be applied with a positive voltage, and the conductive layer 624 can be applied with a negative voltage or electrically grounded. In another example, the second electrode 622 can be applied with a negative voltage or electrically grounded and the conductive layer 624 can be applied with a positively voltage. The electrical force between the second electrode 622 and the conductive layer 624 can be strong enough to bond the first stack 601 and the second stack 602 together as one electrostatic clamp 600.

In some embodiments, the electrostatic clamp 600 can be attached to a chuck 612 through direct bonding, also referred to as optical contact bonding. Optical contact bonding can take place between two substantially defect free and highly polished surfaces without using any adhesives such as epoxy. Optical contact bonding may result from attractive intermolecular interactions, such as Van der Waals forces between bonding surfaces. In some embodiments, post bonding anneal may change the bonding force from Van der Waals bonds to stronger covalent bonds, and thereby strengthen the optical contact bonding.

Exemplary Method for Forming Electrostatic Clamp of Dual Stacks

Figure 7:
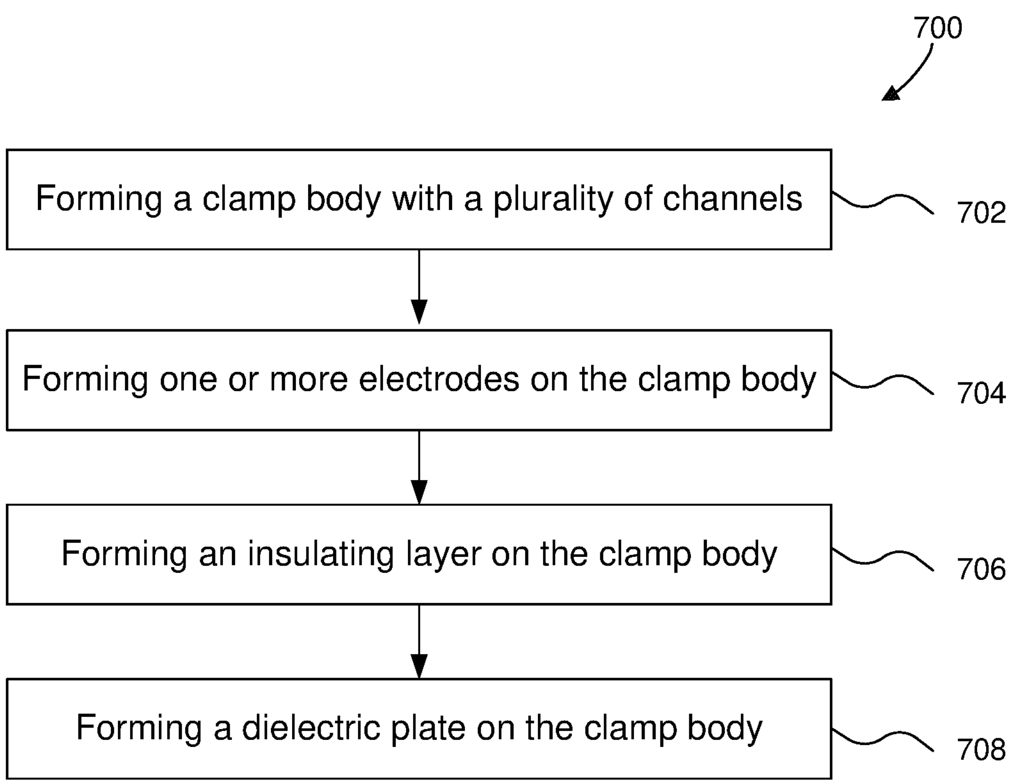
FIG. 7 illustrates an exemplary method for forming a first stack of an electrostatic clamp with dual stacks, according to some embodiments of present disclosure.
Figures 8A, 8B, 8C, 8D:
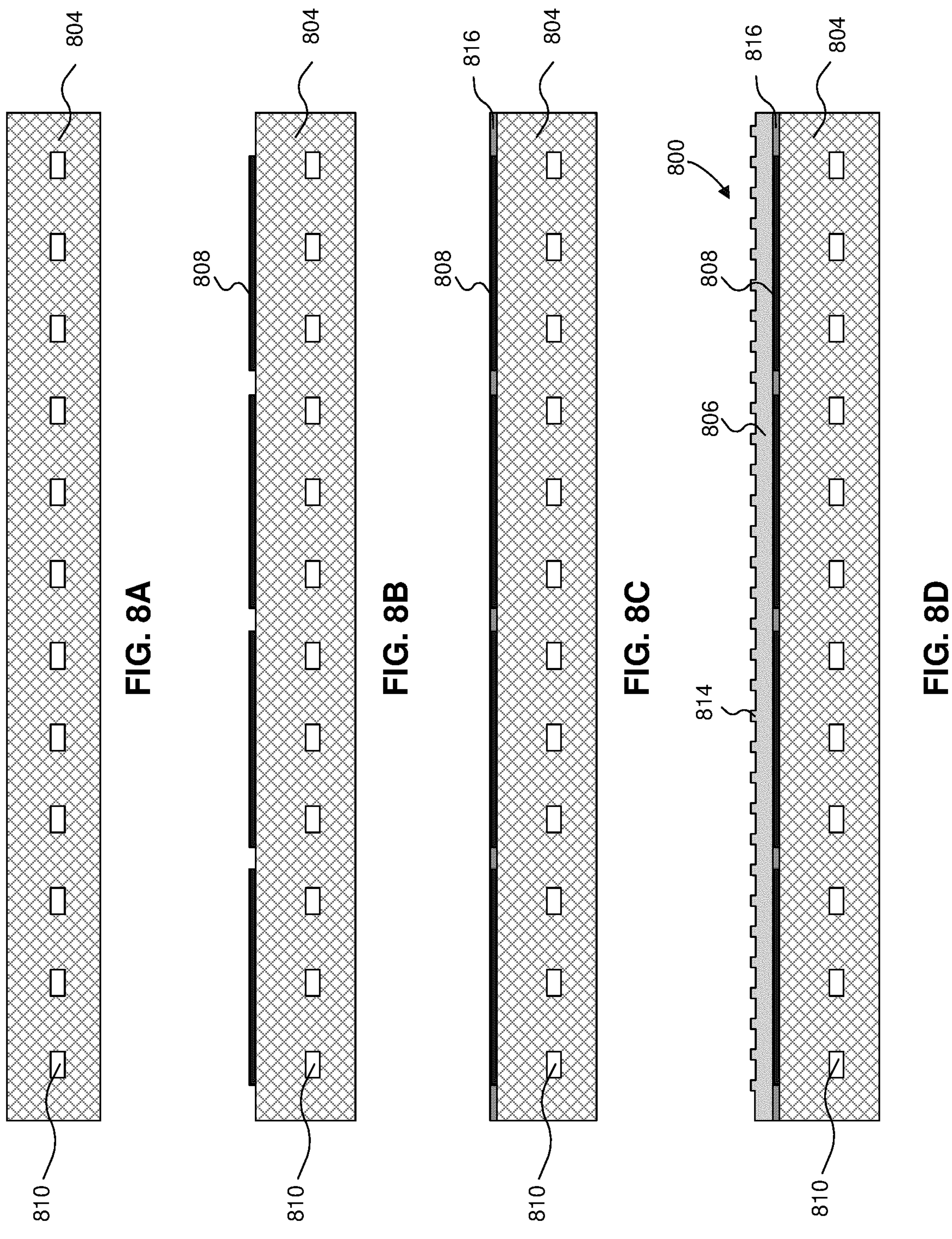
FIGS. 8A-8D illustrate cross-sectional views of a first stack of an electrostatic clamp with dual stacks at various process stages, according to some embodiments of present disclosure.
Figure 9:
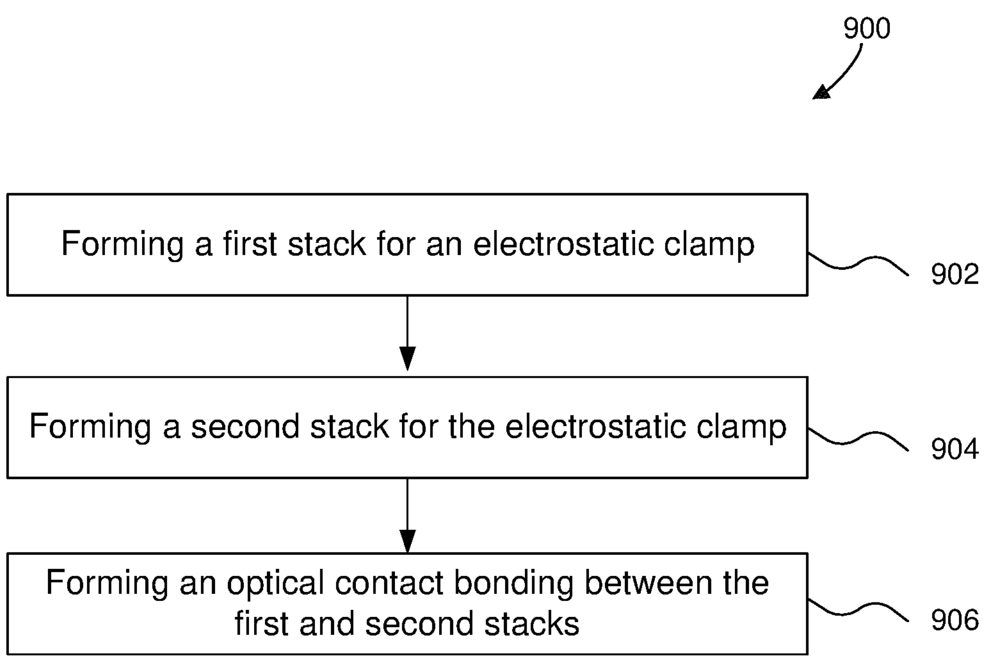
FIG. 9 illustrates an exemplary method for forming an electrostatic clamp with dual stacks, according to some embodiments of present disclosure.
Figures 10A, 10B:
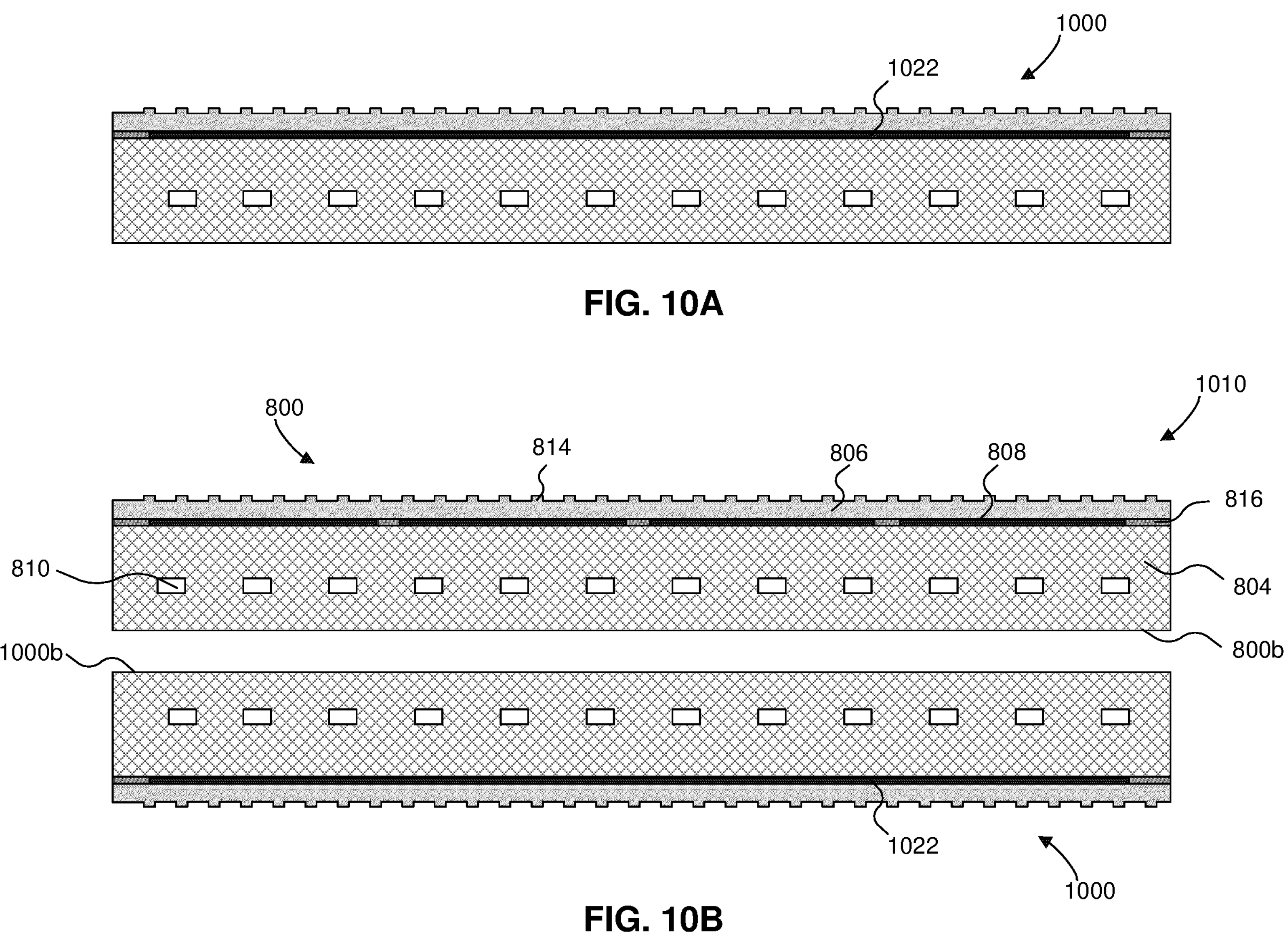
FIGS. 10A and 10B illustrate cross-sectional views of an electrostatic clamp with dual stacks at various process stages, according to some embodiments of present disclosure.
Figure 11:
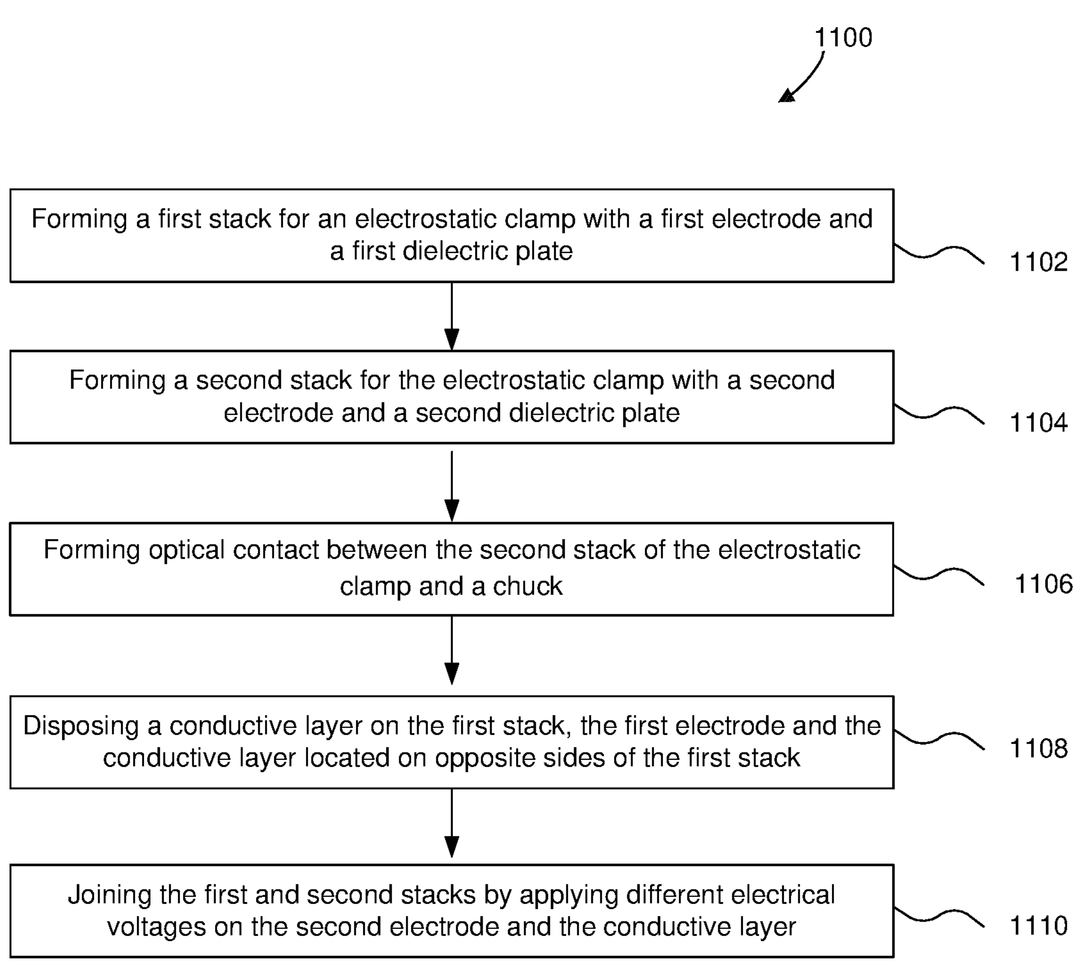
FIG. 11 illustrates an exemplary method for forming an electrostatic clamp with dual stacks, according to some embodiments of present disclosure.

FIGS. 7, 9 and 11 illustrate flow diagrams 700, 900 and 1100 showing methods for forming electrostatic clamps with dual stacks, according to an embodiment. It is to be appreciated that not all steps in FIGS. 7, 9 and 11 may be needed to perform the disclosure provided herein. Further, some of the steps may be performed simultaneously, or in a different order than shown in FIGS. 7, 9 and 11. Flow diagrams 700, 900 and 1100 shall be described with reference to FIGS. 8A-8D, 10A-10B, and 12A-12C, respectively. However, flow diagrams 700, 900, and 1100 are not limited to those exemplary embodiments.

FIG. 7 illustrates a flowchart 700 for manufacturing a first stack of an electrostatic clamp with dual stacks, according to some embodiments of the present disclosure. FIG. 8A-8D illustrates the cross-sectional views of the first stack 800 at various process steps, according to the flowchart 700.

At process step 702 in FIG. 7, a clamp body 804 with a plurality of channels 810 is formed, with an exemplary structure shown in FIG. 8A. The clamp body 804 can be similar to the clamp body 504 in FIG. 5 and the first/second clamp bodies 604/605 in FIG. 6. The clamp body 804 can be made of an insulator with an ultra-low thermal expansion coefficient, and can include, for example, an ultra-low expansion silicon-based material (e.g., ULE® manufactured by Corning), a glass material, a ceramic material, a silicon-based glass ceramic material (e.g., ZERODUR® manufactured by SCHOTT), or any combination thereof.

The surfaces of the clamp body 804 can be polished (or machined) to obtain smoothness with a root mean square (RMS) roughness of about 0.5 nm or lower. The polishing (or machining) process may include any suitable polishing process for glass or ceramic using, for example, cerium oxide slurry.

Subsequent to the polishing, an acid etch may be performed on the surfaces of the clamp body 804 using, for example, an acid mixture comprising hydrofluoric acid. The acid etch may remove few microns (e.g., about 5 microns) of clamp body 804. This removal of material from polished surfaces may help to relieve stress in the clamp body 804 that may be induced from the machining process.

The channels 810 can be similar to the channels 510 in FIG. 5 and the first/second channels 610/611 in FIG. 6. In some embodiments, the channels 810 can be formed by using photolithography and glass etching process. It should be noted that the rectangular cross-sectional shape of the channels 810 in FIG. 8A, is for illustrative purposes, and is not limiting. The channels 810 can have other cross-sectional shapes (e.g., conical, trapezoidal), according to various embodiments, without departing from the scope of the present disclosure.

At process step 704 in FIG. 7, with an exemplary structure in FIG. 8B, one or more electrodes 808 are formed on the clamp body 804. The one or more electrodes 808 can be similar to the first electrodes 508 in FIG. 5 and the first electrodes 608 in FIG. 6. The forming of the one or more electrodes 808 includes depositing a layer of conductive film and patterning using photolithography and etching. The conductive film can be metal or metal alloy, for example, aluminum, chrome, platinum, gold, or any combination thereof. The conductive film can be deposited using any conventional methods suitable for metals such as sputtering, plating, thermal evaporation, atomic layer deposition (ALD), or chemical vapor deposition (CVD). In some embodiment, the forming of the one or more electrodes 808 can also include deposition using a shadow mask.

At process step 706 in FIG. 7, with an exemplary structure shown in FIG. 8C, an insulating layer 816 is formed on the clamp body 804. In some embodiments, the insulating layer 816 can be similar to the first/second insulating layer 516/520 in FIG. 5 and the first/second insulating layer 616/620 in FIG. 6. The insulating layer 816 can be any suitable insulator, for example, silicon oxide, silicon oxynitride, silicon nitride, polyimide, spin-on-glass, or any combination thereof. The formation of the insulating layers 816 may include deposition and patterning. The insulating layer 816 can be deposited by using any conventional methods suitable for dielectric materials such as, but not limited to, CVD, sputtering, evaporation and spin-on coating. The insulating layer 816 can then be patterned by using photolithography and etching. In some embodiments, the formation of the insulating layer 816 can also include a planarization process, for example, chemical-mechanical polishing, such that the insulating layer 816 can be coplanar with the one or more electrodes 808.

At process step 708 in FIG. 7, with an exemplary structure shown in FIG. 8D, a dielectric plate 806 is formed on the clamp body 804. In some embodiments, the dielectric plate 806 can be formed on top of the one or more electrodes 808 and the insulating layer 816. In some embodiments, the dielectric plate 806 can be similar to the first/second dielectric plates 506/518 and the first/second dielectric plates 606/618. In some embodiments, the dielectric plate 806 can also be made of an insulator having ultra-low thermal expansion coefficient. In some embodiment, the dielectric plate 806 can be made of the same material as the clamp body 804, such that thermal stress due to thermal expansion mismatch between dissimilar materials can be minimized.

In some embodiments, the dielectric plate 806 also include a plurality of burls 814. The burls 814 can be the burls 514 in FIG. 5 and burls 614 in FIG. 6. The burls 814 can be formed by patterning the dielectric plate 806 using photolithography and etching. The etching of the dielectric plate 806 includes wet etching or dry etching (e.g., reactive-ion-etching). It should be noted that the rectangular cross-sectional shape of burls 814 is for illustrative purposes, and is not limiting. Burls 814 can have other cross-sectional shapes (e.g., spherical, conical, trapezoidal), according to various embodiments, without departing from the scope of the present disclosure.

After completing the process step 708 in FIG. 7, the first stack 800 (as shown in FIG. 8D) for an electrostatic clamp with dual stacks is completed. The first stack 800 can be similar to the first stack 501 in FIG. 5 and the first stack 601 in FIG. 6.

FIG. 9 illustrates a flowchart 900 for manufacturing an electrostatic clamp with dual stacks, according to some embodiments of the present disclosure. FIG. 10A-10B illustrates the cross-sectional views of the electrostatic clamp 1010 with dual stacks at various process steps, according to the flowchart 900.

At process step 902 in FIG. 9, a first stack is formed for an electrostatic clamp with dual stacks. The first stack can be formed using the flowchart 700 in FIG. 7. An example of the first stack is the first stack 800 shown in FIG. 8D.

At process step 904 in FIG. 9, a second stack is formed for the electrostatic clamp with dual stacks. An example of the second stack is shown as the second stack 1000 in FIG. 10A. The second stack 1000 can be formed using similar process steps in the flowchart 700 in FIG. 7. In an example, the second stack 1000 can have a single electrode 1022. The number of electrodes of the second stack 1000 can be more and is not limited in the scope of this disclosure.

At process step 906 in FIG. 9, the first stack 800 and the second stack 1000 of the electrostatic clamp are bonded together through an optical contact bonding. As such, an electrostatic clamp 1010 with dual stacks is formed. FIG. 10B shows the configuration of the first stack 800 and the second stack 1000 at the optical contact bonding. In this configuration, the second stack 1000 is flipped upside down and the bonding interface is between the clamp bodies of the first and second stacks. The electrostatic clamp 1010 after bonding can be the electrostatic clamp 500 in FIG. 5.

The optical contact bonding process may include polishing and cleaning bottom surfaces **800*b* and 1000*b* of bonding interface prior to the optical contact bonding. Bottom surfaces 800*b* and 1000*b* can be polished to a root mean square (RMS) roughness of about 0.5 nm or lower using any suitable polishing process, such as, but not limited to, cerium oxide slurry polishing process. Subsequently, the first stack 800 can be directly bonded to the second stack 1000 by pressing the bottom surface 800*b* against the bottom surface 1000*b* under a pressure suitable for the substrate materials used. Optionally, the electrostatic clamp 1010** with dual stacks may be annealed at a temperature in the range of about 200-1200 degrees Celsius to strengthen the bond.

The optical contact bonding (also referred to as direct bonding) is a bonding between substantially defect free and highly polished surfaces (e.g., bottom surfaces **800*b* and 1000*b*) without the use of any bonding material, such as epoxy or any other adhesive material, according to an embodiment. Optical contact bonding may result from attractive intermolecular interactions, such as Van der Waals forces between the bonding surfaces (e.g., bottom surfaces 800*b* and 1000*b***). Annealing the optical contact bond (as described above) may transform, for example, the Van der Waals bonds between the bonding surfaces into stronger covalent bonds, and thereby strengthen the optical contact bonded structure.

Figures 12A, 12B:
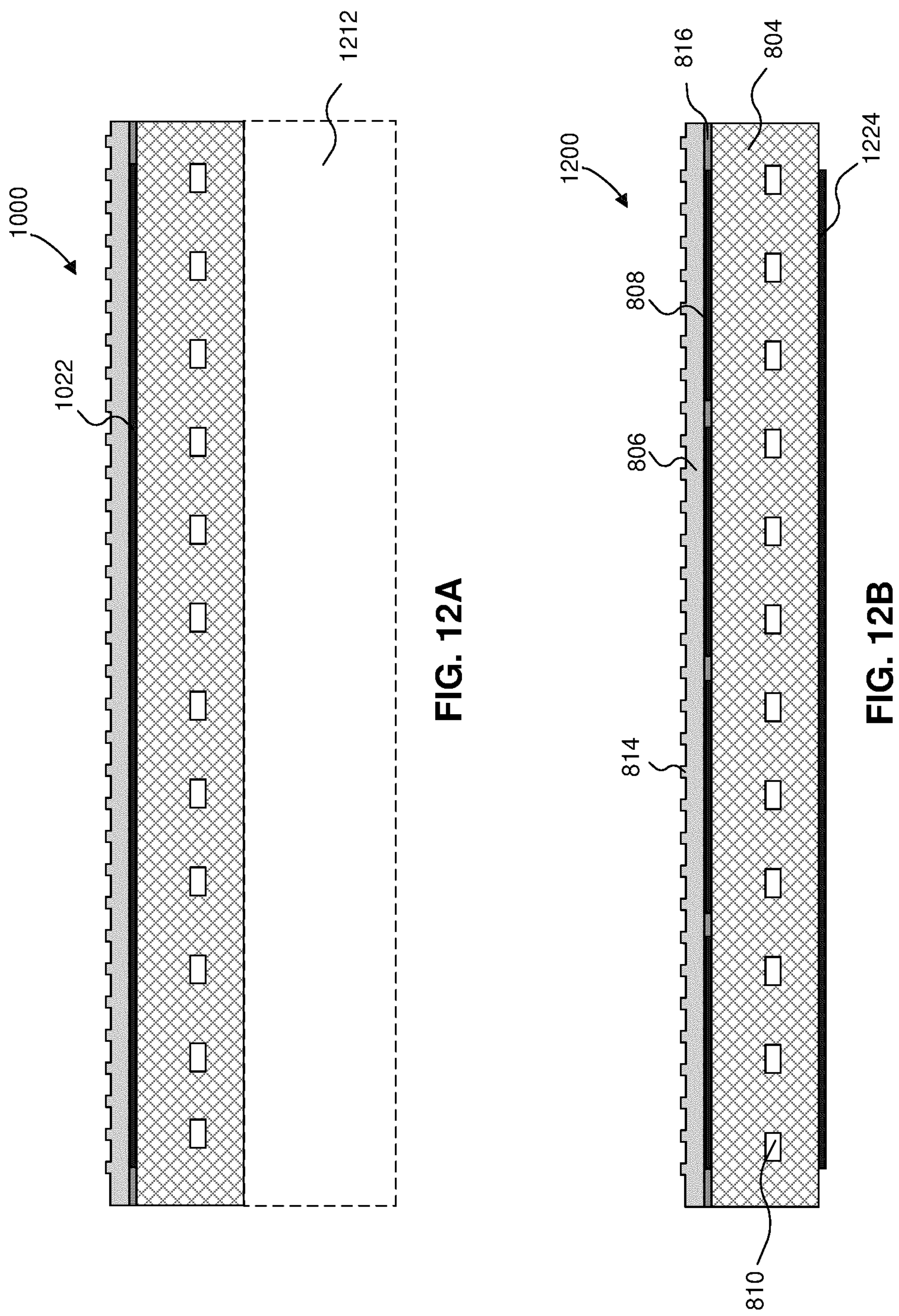
FIGS. 12A-12C illustrate cross-sectional views of an electrostatic clamp with dual stacks at various process stages, according to some embodiments of present disclosure.
Figure 12C:
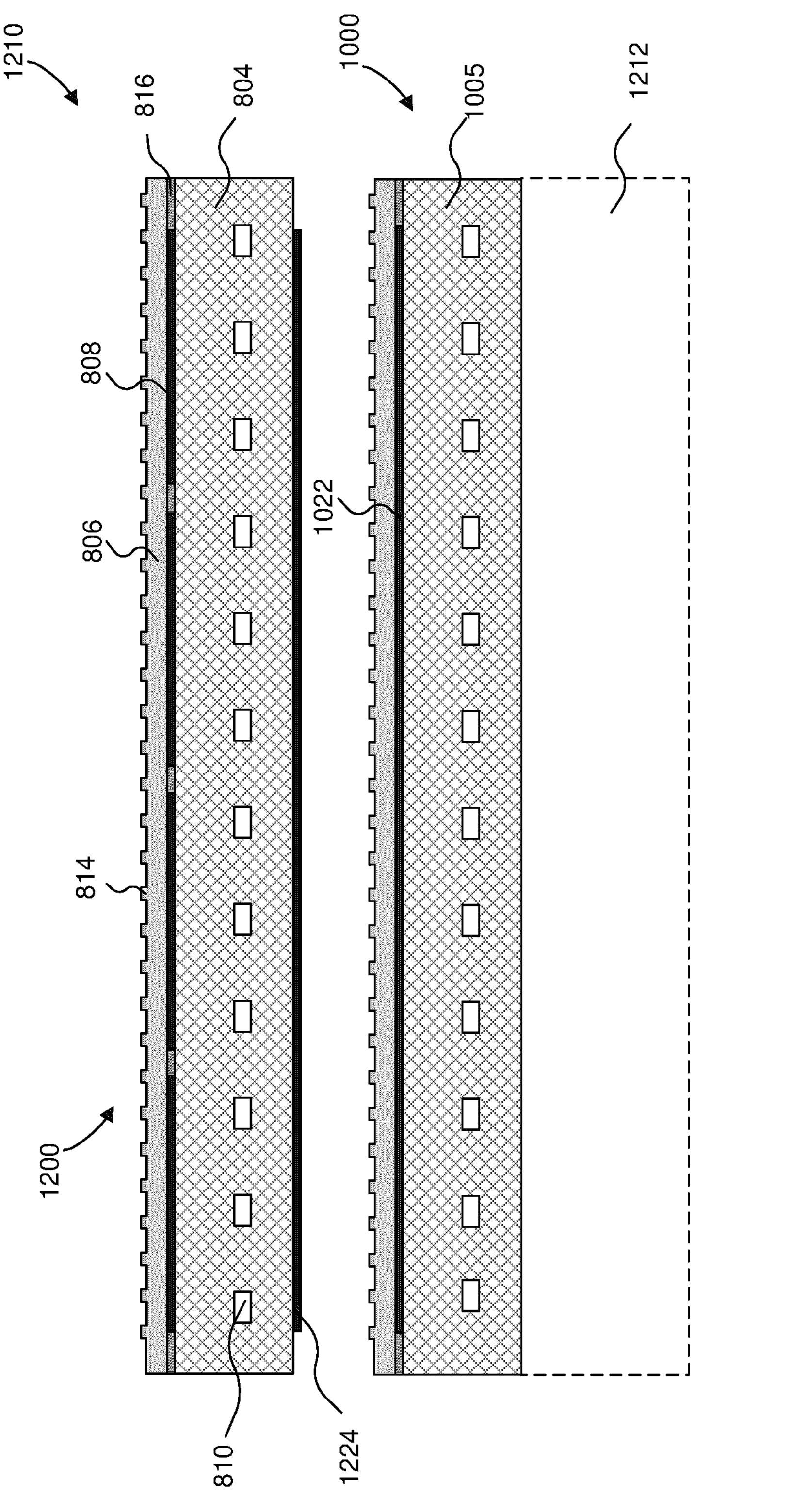

FIG. 11 illustrates a flowchart 1100 for manufacturing an electrostatic clamp with dual stacks, according to some embodiments of the present disclosure. FIG. 12A-12C illustrates the cross-sectional views of the electrostatic clamp 1210 with dual stacks at various process steps, according to the flowchart 1100.

At process step 1102, a first stack is formed for an electrostatic clamp with a first electrode and a first dielectric plate. The first stack can be the first stack 800 in FIG. 8D, and can be fabricated using flowchart 700 in FIG. 7.

At process step 1104, a second stack is formed for the electrostatic clamp with a second electrode and a second dielectric plate. The second stack can be the second stack 1000 shown in FIG. 10A, and can be fabricated according to the description for process step 904 in FIG. 9.

At process step 1106, the second stack 1000 is bonded on a chuck 1212 through direct bonding (e.g., an optical contact bonding). An exemplary structure is shown in FIG. 12A, where the chuck 1212 can be a wafer chuck, a reticle chuck or any suitable chuck in a vacuum system.

At process step 1108, a conductive layer is disposed on the first stack 800, wherein the first electrode and the conductive layer are on the opposite sides of the first stack. An exemplary structure 1200 is shown in FIG. 12B, where the conductive layer 1224 functioned as a single electrode is illustrated. However, the number of the conductive layers 1224 (e.g., electrodes) is not so limited and can be any suitable numbers. The conductive layer 1224 can be formed using similar material and process to the first electrode 808 in FIG. 8B.

At process step 1110, the first and the second stacks are joined together by applying different electrical voltages on the second electrode and the conductive layer. FIG. 12C shows the configuration of the first stack 1200 with the first electrode 808 and the conductive layer 1224 and the second stack 1000 with the second electrode 1022 at joining processing. The electrostatic clamp 1210 at completion can be similar to 600 in FIG. 6.

As described above, the first stack 800 and the second stack 1000 can be fabricated in parallel during manufacturing. The electrostatic clamp with dual stacks can be formed by joining the first stack 800 and the second stack 1000 together, either through an optical contact bonding (as shown in FIGS. 9 and 10) or through electrical force controlled by the electrodes on the first and second stacks (as shown in FIGS. 11 and 12). Thereby, the electrostatic clamp with dual stacks 1010 in FIG. 10B or 500 in FIG. 5, and the electrostatic clamp with dual stacks 1210 in FIG. 12C or 600 in FIG. 6, can be formed, respectively. The electrostatic clamps 500 in FIG. 5 or 600 in FIG. 6 allow fast and easy wafer/reticle mounting and unmounting during operation by applying a voltage on the first electrode 808. In the meantime, the electrostatic clamps 500 can also allow fast and easy clamp mounting and unmounting through voltage control of the second electrode 522. The electrostatic clamps 600 can also allow fast and easy clamp mounting and unmounting through voltage control of the second electrode 622 and the conductive layer 624.

The embodiments may further be described using the following clauses:

1. An electrostatic clamp, comprising:

a first stack and a second stack, wherein the first stack is joined with the second stack and each of the first and second stacks comprises:

a clamp body;

one or more electrodes disposed on the clamp body;

a dielectric plate disposed on the electrodes; and a plurality of channels inside the clamp body.

2. The electrostatic clamp of clause 1, wherein the first and second stacks are joined by an optical contact bonding.

3. The electrostatic clamp of clause 1, wherein the first stack comprises a conductive layer, wherein the conductive layer and the one or more electrodes are on the opposite side of the clamp body.

4. The electrostatic clamp of clause 3, wherein the first and second stacks are joined through an electrical force generated between the conductive layer of the first stack and the one or more electrodes of the second stack.

5. The electrostatic clamp of clause 1, wherein the clamp body comprises an insulator with ultra-low expansion coefficient.

6. The electrostatic clamp of clause 1, wherein the plurality of channels are configured to carry a thermally conditioned liquid or gas.

7. The electrostatic clamp of clause 1, wherein each of the first and second stacks further comprises an insulating layer, configured to electrically isolate the one or more electrodes.

8. The electrostatic clamp of clause 1, wherein the dielectric plate comprises a plurality of burls.

9. A method for fabricating an electrostatic clamp, comprising:

forming a first stack of the electrostatic clamp;

forming a second stack of the electrostatic clamp; and joining the first stack with the second stack.

10. The method of clause 9, wherein the forming of the first and second stacks of the electrostatic clamp comprising:

forming a plurality of channels in a clamp body;

forming one or more electrodes on the clamp body;

forming an insulating layer on the clamp body; and forming a dielectric plate on the one or more electrodes.

11. The method of clause 10, further comprising forming a plurality of burls on the dielectric plate.

12. The method of clause 10, wherein the joining of the first stack with the second stack comprises:

polishing bottom surfaces of the first and second stacks of the electrostatic clamp, wherein the bottom surface and the dielectric plate are on opposite sides of the respective clamp bodies of the first and second stacks; and forming an optical contact bonding between the polished bottom surfaces of the first and second stacks.

13. The method of clause 10, wherein the joining of the first stack with the second stack comprises:

disposing a conductive layer on a bottom surface of the first stack, wherein the bottom surface and the dielectric plate of the first stack are on the opposite sides of the clamp body;

applying a first voltage on the conductive layer of the first stack; and applying a second voltage, different from the first voltage, on the one or more electrodes of the second stack.

14. A lithography apparatus comprising the electrostatic clamp of clause 1.

15. The lithography apparatus of clause 14, further comprising:

an illumination apparatus configured to illuminate a pattern on a patterning device; and a projection system configured to project an image of the pattern onto a substrate;

wherein the substrate is disposed on the electrostatic clamp.

16. The lithography apparatus of clause 15, wherein the first stack comprises a conductive layer, wherein the conductive layer and the one or more electrodes are on the opposite side of the clamp body.

17. The lithography apparatus of clause 16, wherein the first and second stacks are joined through an electrical force generated between the conductive layer of the first stack and the one or more electrodes of the second stack.

18. The lithography apparatus of clause 14, further comprising:

an illumination apparatus configured to illuminate a pattern on a patterning device, wherein the patterning device is disposed on the electrostatic clamp; and a projection system configured to project an image of the pattern onto a substrate.

19. The lithography apparatus of clause 18, wherein the first stack comprises a conductive layer, wherein the conductive layer and the one or more electrodes are on the opposite side of the clamp body.

20. The lithography apparatus of clause 19, wherein the first and second stacks are joined through an electrical force generated between the conductive layer of the first stack and the one or more electrodes of the second stack.

Although specific reference may be made in this text to the use an electrostatic clamp in lithographic apparatus, it should be understood that the electrostatic clamp described herein may have other applications, such as for use in mask inspection apparatus, wafer inspection apparatus, aerial image metrology apparatus and more generally in any apparatus that measures or processes an object such as a wafer (or other substrate) or mask (or other patterning device) either in vacuum or in ambient (non-vacuum) conditions, such as, for example in plasma etching apparatus or deposition apparatus.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, LCDs, thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track unit (a tool that typically applies a layer of resist to a substrate and develops the exposed resist), a metrology unit and/or an inspection unit. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

It is to be understood that the phraseology or terminology herein is for the purpose of description and not of limitation, such that the terminology or phraseology of the present specification is to be interpreted by those skilled in relevant art(s) in light of the teachings herein.

The term "substrate" as used herein describes a material onto which material layers are added. In some embodiments, the substrate itself may be patterned and materials added on top of it may also be patterned, or may remain without patterning.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical, or other forms of propagated signals, and others. Further, firmware, software, routines, and/or instructions may be described herein as performing certain actions. However, it should be appreciated that such descriptions are merely for convenience and that such actions in fact result from computing devices, processors, controllers, or other devices executing the firmware, software, routines, and/or instructions.

The following examples are illustrative, but not limiting, of the embodiments of this disclosure. Other suitable modifications and adaptations of the variety of conditions and parameters normally encountered in the field, and which would be apparent to those skilled in the relevant art(s), are within the spirit and scope of the disclosure.

Although specific reference may be made in this text to the use of the apparatus and/or system according to the invention in the manufacture of ICs, it should be explicitly understood that such an apparatus and/or system has many other possible applications. For example, it can be employed in the manufacture of integrated optical systems, guidance and detection patterns for magnetic domain memories, LCD panels, thin-film magnetic heads, etc. The skilled artisan will appreciate that, in the context of such alternative applications, any use of the terms "reticle," "wafer," or "die" in this text should be considered as being replaced by the more general terms "mask," "substrate," and "target portion," respectively.

While specific embodiments of the invention have been described above, it will be appreciated that the invention may be practiced otherwise than as described. The description is not intended to limit the invention.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein.

The breadth and scope of the present invention should not be limited by any of the above-described exemplary embodiments, but should be defined only in accordance with the following claims and their equivalents.

The invention claimed is:

1. An electrostatic clamp, comprising:

a first stack and a second stack, wherein the first stack is joined with the second stack by an optical contact bonding and each of the first and second stacks comprises:

a clamp body;

one or more electrodes disposed on the clamp body, the one or more electrodes connected or connectable to an electrical power source; and a dielectric disposed on the one or more electrodes, wherein each of the first and second stacks comprises a channel inside the clamp body.

2. The electrostatic clamp of claim 1, wherein the clamp body comprises an insulator with ultra-low expansion coefficient.

3. The electrostatic clamp of claim 1, wherein each channel is configured to carry a thermally conditioned liquid or gas.

4. The electrostatic clamp of claim 1, wherein each of the first and second stacks further comprises an insulating layer, configured to electrically isolate the one or more electrodes.

5. The electrostatic clamp of claim 1, wherein the dielectric comprises a plurality of burls.

6. A lithography apparatus comprising the electrostatic clamp of claim 1.

7. The lithography apparatus of claim 6, further comprising:

an illumination apparatus configured to illuminate a pattern on a patterning device; and a projection system configured to project an image of the pattern onto a substrate, wherein the electrostatic clamp is configured to hold the substrate.

8. The lithography apparatus of claim 7, wherein the first stack comprises a conductive layer, and wherein the conductive layer and the one or more electrodes are on opposite sides of the clamp body of the first stack.

9. The lithography apparatus of claim 8, wherein the first and second stacks are joined through an electrical force generated between the conductive layer of the first stack and the one or more electrodes of the second stack.

10. The lithography apparatus of claim 6, further comprising:

an illumination apparatus configured to illuminate a pattern on a patterning device, wherein the electrostatic clamp is configured to hold the patterning device; and a projection system configured to project an image of the pattern onto a substrate.

11. The lithography apparatus of claim 10, wherein the first stack comprises a conductive layer, and wherein the conductive layer and the one or more electrodes are on opposite sides of the clamp body of the first stack.

12. The lithography apparatus of claim 11, wherein the first and second stacks are joined through an electrical force generated between the conductive layer of the first stack and the one or more electrodes of the second stack.

13. A method for fabricating an electrostatic clamp, the method comprising:

forming a first stack of the electrostatic clamp;

forming a second stack of the electrostatic clamp; and joining the first stack with the second stack by optical contact bonding, wherein each of the first and second stacks comprises a channel inside the electrostatic clamp.

14. The method of claim 13, wherein the forming of the first and second stacks of the electrostatic clamp comprises, for each of the first and second stacks:

forming one or more electrodes on a clamp body; and forming a dielectric on the one or more electrodes.

15. The method of claim 14, further comprising forming a plurality of burls on the dielectric.

16. The method of claim 14, wherein the joining of the first stack with the second stack comprises:

polishing bonding surfaces of the respective first and second stacks, wherein the bonding surface and the dielectric are on opposite sides of the respective clamp bodies of the first and second stacks; and forming the optical contact bonding between the polished bonding surfaces of the first and second stacks.

17. An electrostatic clamp, comprising:

a first stack and a second stack, wherein the first stack is joined with the second stack and each of the first and second stacks comprises:

a clamp body;

one or more electrodes, the one or more electrodes connected or connectable to an electrical power source; and a dielectric, wherein the first stack comprises a conductive layer, the conductive layer not connected or not connectable to an electrical power source, and wherein the conductive layer and the one or more electrodes of the first stack are on opposite sides of the clamp body of the first stack.

18. The electrostatic clamp of claim 17, wherein the first and second stacks are joined through an electrical force generated between the conductive layer of the first stack and the one or more electrodes of the second stack.

19. The electrostatic clamp of claim 17, wherein the clamp body comprises an insulator with ultra-low expansion coefficient.

20. The electrostatic clamp of claim 17, wherein the dielectric comprises a plurality of burls.

* * * * *